United States Patent [19]

Washburn

[11] 4,158,182
[45] Jun. 12, 1979

[54] LOW NOISE OSCILLATOR CIRCUIT

[75] Inventor: Clyde Washburn, Fairport, N.Y.

[73] Assignee: Harris Corporation, Cleveland, Ohio

[21] Appl. No.: 929,316

[22] Filed: Jul. 31, 1978

[51] Int. Cl.$^2$ .............................................. H03B 5/12
[52] U.S. Cl. ................. 331/117 R; 325/473; 330/277
[58] Field of Search .................. 331/117 R, 116; 330/277; 325/473; 307/279

[56] References Cited

U.S. PATENT DOCUMENTS

| 3,281,699 | 10/1966 | Harwood | 331/117 R |
| 3,436,681 | 4/1969 | Hart | 331/117 R |
| 3,534,294 | 10/1970 | Aver | 331/117 R |
| 3,775,698 | 11/1973 | Nugent et al. | 331/117 R |

Primary Examiner—John Kominski

[57] ABSTRACT

A low noise, high frequency oscillator (50) is disclosed which includes a JFET (100) having a tuned circuit (102) connected in a feedback arrangement with it. The JFET is operated in a self-biasing mode and includes a gate biasing circuit (104) comprised of a capacitor (114) and a resistor (116). The capacitor (114) and resistor (116) are selected such that the gate bias circuit (104) represents a low impedance path to low frequency noise components. These low frequency noise components are therefore shunted to ground, and do not modulate the operation of the JFET (100). This significantly reduces noise in the oscillator output signal. A hot carrier diode (118) is connected across the gate-to-source junction of the JFET (100) to reduce loading on the tuned circuit (102) by the JFET (100).

8 Claims, 4 Drawing Figures

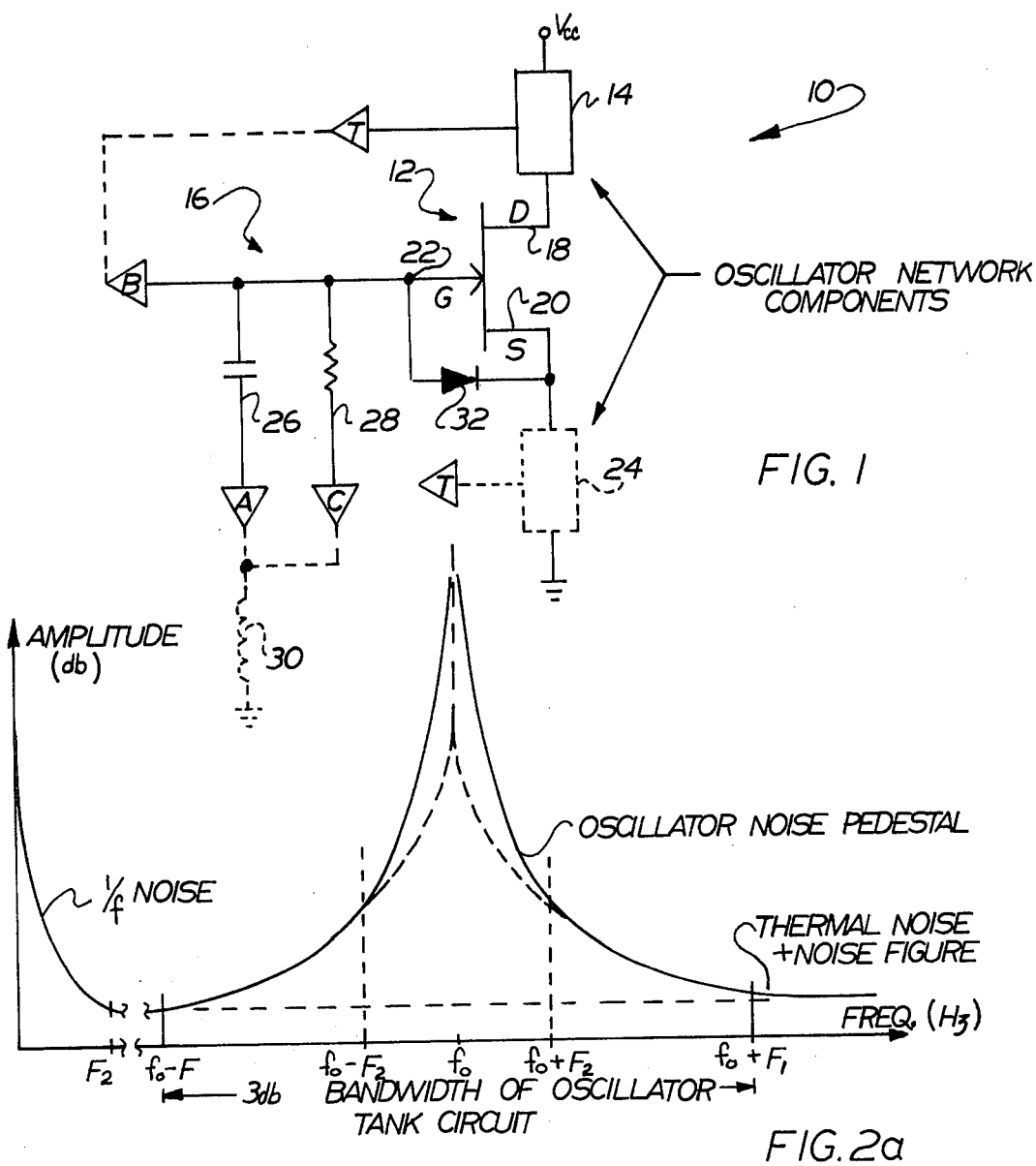
FIG. 1
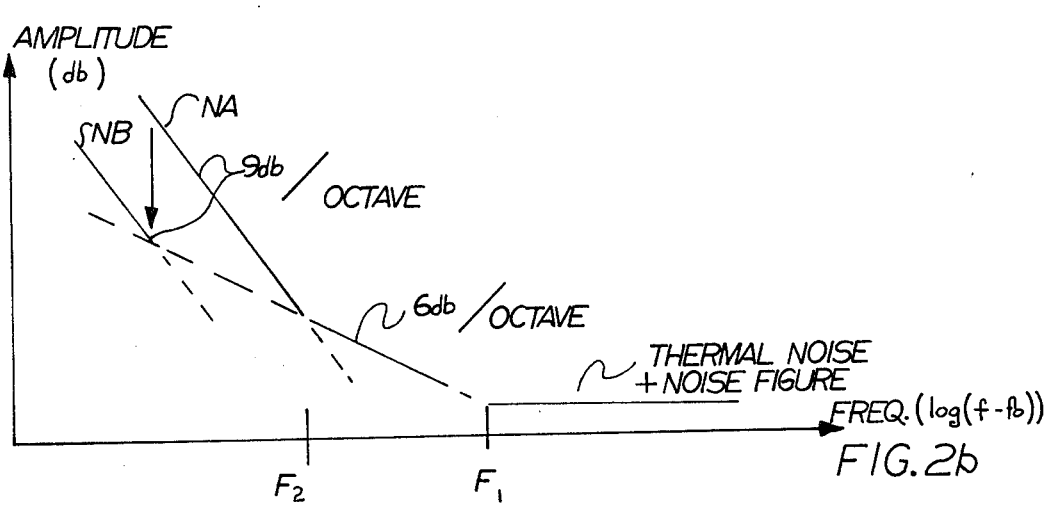
FIG. 2a
FIG. 2b

LOW NOISE OSCILLATOR CIRCUIT

BACKGROUND AND FIELD OF THE INVENTION

The present invention relates generally to oscillator circuits, and more particularly to a low noise oscillator circuit which employs a self-biasing JFET amplifier.

A feedback oscillator may broadly be defined as an amplifier whose output is fed, in phase, to its input through a frequency selective circuit (usually a high-Q tank circuit). Feedback oscillator designs are known which utilize junction field-effect transistors (JFET's) as the amplification element. In general, oscillation amplitude stability is provided in these circuits by constructing them so that the degree to which the JFET loads the tank circuit increases with increasing amplitude of oscillation. Thus, as the level of oscillation increases, the loading of the tank circuit by the JFET also increases. This, in turn, results in a reduction in the loop gain of the oscillator. Eventually, a point is reached at which the loop gain is reduced to unity, thus establishing oscillatory equilibrium.

Although this technique is quite acceptable for many uses, it has the disadvantage that the output signal is rather noisy. In many applications, however, it is highly desirable that amount of noise in the output signal be reduced to as great a degree as possible. In multichannel communication systems, for example, it is desirable that the noise sideband profile of the carrier oscillator be reduced to as low a level as possible so as to minimize both on channel, and adjacent-channel noise.

Other JFET oscillator circuits are known which do not rely upon tank circuit loading in order to establish oscillatory equilibrium. These oscillators, known as self-limiting JFET oscillators, utilize the gate-to-source junction of the JFET in order to provide peak rectification of the gate signal. A capacitor and resistor are connected in the gate circuit in order to filter this rectified signal and thereby develop a gate-biasing signal. Oscillators of this type are described on pages 241-243 and 131-137 of the book entitled "Communication Circuits: Analysis and Design", published in 1971 by the Addison-Wesley Publishing Company. The capacitor utilized in the gate biasing circuit of these oscillators is selected to be an AC short circuit at the oscillation frequency, whereas the resistor is selected to be in the range of one to ten megohms in order to prevent any significant loading of the tuned circuit.

This oscillator circuit, while not producing the amounts of noise present in oscillator circuits which rely upon the loading of the tank circuit to establish equilibrium, nonetheless still includes some amount of undesirable noise at the output thereof.

SUMMARY OF THE PRESENT INVENTION

It is an object of the present invention to provide a JFET oscillator circuit having extremely low noise characteristics.

It is a more specific object of the present invention to provide a self-limiting junction field effect semiconductor oscillator wherein the capacitor and resistor utilized in the gate biasing circuit are selected in accordance with low frequency noise considerations.

It is an additional object of the present invention to provide an additional, low stored-charge diode in parallel with the gate-to-source junction in order to limit the loading of the tank circuit due to the resistive effects of conduction of the gate-to-source junction.

It is yet another object of the present invention to provide a low noise JFET oscillator for use in a transmitter system.

It has been found that the noise present in the output of a self-limiting JFET oscillator is partly due to the contributions of current noise which, developed across circuit components, effectively appears in series with the RF signal in the gate circuit of the JFET. The low value capacitors uniformly employed in the past in the gate biasing circuit of the transistor represent quite high impedances to these low frequency noise contributions. Consequently, the noise current produces a corresponding voltage across the gate biasing capacitor. This noise voltage therefore appears in series with the gate-to-source junction in the FET. The carrier signal is thus modulated by the noise, which appears at the output of the oscillator as upper and lower sideband noise, immediately adjacent the carrier. These noise components can be substantially reduced by increasing the value of the gate biasing capacitor to the point where it represents a very low impedance to the low frequency noise components.

When this is done, however, the gate-to-source junction of the JFET can represent a significant load upon the tuned circuit, particularly when the oscillator is operated at high frequencies. This effect can be reduced by connecting a hot carrier diode (or similar low stored charge diode) directly across the gate-to-source junction. This diode then assumes the peak rectification function, but does not load the tank circuit to the extent that the gate-to-source junction of the JFET would.

A low noise, high frequency oscillator is therefore disclosed herein which includes a junction field effect semiconductor device, such as a JFET, having two electrodes defining therebetween a primary current path, and an electrode for controlling the primary current. A tuned circuit is coupled between one (or both) of the electrodes in the primary current path, and the gate electrode. A gate biasing circuit generates a DC bias voltage and applies it to the gate electrode. This gate biasing circuit includes a capacitor coupled between the gate electrode and a power supply connection, and a resistor which is connected to provide a DC current path across the capacitor.

In accordance with the present invention, the capacitor and resistor of the gate bias circuit have values which have been selected so that the gate bias circuit represents a low impedance to low frequency current noise contributions. The noise in the output of the circuit is thus reduced by the amount of this noise.

In accordance with another aspect of the present invention, a low stored-charge diode is connected between the gate electrode and one of the primary electrodes of the JFET. This diode provides peak rectification of the signal applied to the gate electrode so as to thereby develop a biasing voltage across the capacitor of the gate biasing means independently of the corresponding junction of the JFET, thereby reducing loading on the tuning circuit.

BRIEF DESCRIPTION OF THE DRAWINGS

The foregoing and other objects and advantages of the present invention will become more readily apparent from the following description of a preferred embodiment, as taken in conjunction with the accompanying drawings, wherein:

FIG. 1 is a schematic representation of the present invention, in its broader aspects;

FIGS. 2a and b are graphical illustrations of the noise spectrum of the oscillator of FIG. 1.

DETAILED DESCRIPTION OF THE DRAWINGS

Figure 3:
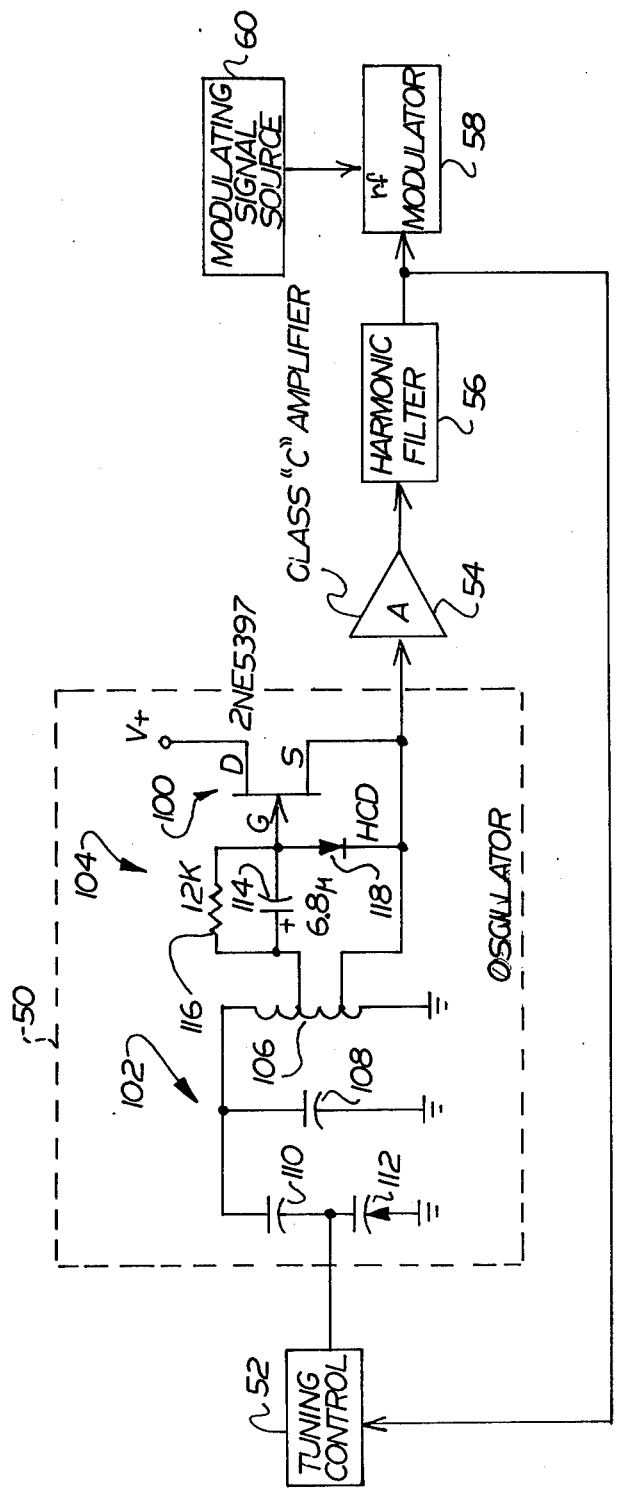
FIG. 3 is a more detailed diagram of an oscillator in accordance with the present invention, as used in a transmitter system.

FIG. 1 is a schematic illustration of a self-limiting JFET oscillator 10. Oscillator 10 generally includes three elements: an amplifier element 12, a tuned circuit 14, and a gate biasing circuit 16.

In the illustrated embodiment, the amplifier element 12 is a standard JFET having drain and source electrodes 18 and 20 and a gate electrode 22. The voltage on the gate electrode 22 controls the primary current passing between drain and source electrodes 18 and 20 in accordance with well known equations.

An oscillator network 14 is included which will generally be a high "Q" tuned circuit composed of capacitive and inductive components. This tuned circuit is illustrated as being connected in the drain circuit of JFET 12, but may instead be located in the source circuit as indicated by the dotted block 24, or connected to both drain and source circuits. In either event, the tuned circuit will include a feedback tap T for feeding back a portion of the RF signal to the gate biasing circuit 16 in order to provide the positive feedback necessary for oscillator operation. The gate biasing circuit 16 includes a capacitor 26 and a resistor 28.

The connection between the feedback tap T of tuned circuit 14 and gate biasing circuit 16 will be dictated by several considerations. Since a DC biasing voltage will be developed on gate electrode 22, there should not be a low impedance DC connection between any power supply terminal and the gate electrode 22. On the other hand, capacitor 26 of gate biasing circuit 16 must be returned to one of the power supply connections through a low impedance circuit.

If terminal T does not represent a low impedance DC connection to one of the power supply terminals (as, for example, when the feedback tap T is taken from between two capacitors), then the tap T will be connected to a terminal B of the gate biasing circuit, and hence directly to the gate electrode 22. In this event, the capacitor 26 will have its terminal A connected directly to ground (or any other convenient power supply connection) through an RF-blocking inductor 30. The RF-blocking inductor 30 is included to prevent the capacitor 26 from shorting the RF feedback signal to ground. If, on the other hand, tap T does represent a low impedance DC path to ground (as, for example, when the tap is taken at a selected point along an inductor which has a direct connection to a power supply terminal), then tap T can be directly connected to terminal A of the gate biasing circuit.

These considerations will also apply if the tuned circuit is instead connected in the source circuit at 24. In any case, the gate electrode 22 will be essentially isolated from the power supply voltages, and the terminal A will be connected to ground through a low impedance DC circuit.

The resistor 28 is included to provide a path to dissipate the charge built up on capacitor 26. If resistor 28 were not included, discharge of capacitor 26 could only result from leakage current through the gate-to-source junction of JFET 12 and from leakage through the capacitor, itself. As will become evident as this disclosure is more fully made, this would result in an unacceptable delay between the time the oscillator was shut off, and the time at which restart of oscillation could occur. Resistor 28 will generally be connected directly across capacitor 26, but could instead be returned to any suitable bias voltage.

The transconductance of JFET 12, and thus the loop gain of the oscillator, is a relatively linear function of the gate-to-source voltage applied to the JFET. Transconductance, and thus loop gain, will be greatest when this voltage is approximately zero. The oscillator is thus designed so that, under this condition, the oscillator loop gain is greater than unity.

The gate electrode will be at a ground DC level upon application of power to the oscillator. Since the gate-to-source voltage will then be about zero (or at some other desired bias level), the loop gain of the oscillator will be at a maximum, and oscillation will begin. As oscillation builds up, the RF signal fed back to the gate electrode 22 will increase to the point where the positive excursions of the signal on gate electrode 22 exceed the gate-to-source contact potential of JFET 12. The gate-to-source junction will therefore begin to conduct during the peaks of the RF cycle, causing partial (peak) rectification of the RF signal. A negative bias voltage will thus be developed across the gate bias circuit. This negative bias voltage will reduce the loop gain of the oscillator to some extent. Further increases in the amplitude of oscillation will cause this bias voltage to become more and more negative, reducing the loop gain by greater and greater amounts. Eventually, the bias voltage will reach a point at which the loop gain will have been reduced to unity. The operation of the oscillator will therefore stabilize at this point.

This circuit has several inherent advantages, both of which contribute to a reduction in the amount of noise present in the output of the oscillator. Firstly, the gate biasing circuit 16 can be designed so that it provides very little loading of the tuned circuit 14, thus preserving as high a loaded "Q" of the tank circuit as possible. Secondly, this self-biasing operation inherently maximizes signal power in the tank circuit. This is because the operation of the oscillator is always such that the peaks of the RF signal just reach the contact potential of the gate-to-source junction of the field effect transistor. Since current through the transistor is maximum at this time, the current through the tuned circuit is also inherently maximized.

The sources and nature of the remaining noise in the output spectrum of the oscillator may be more readily understood through reference to the frequency diagrams of FIGS. 2a and 2b. FIG. 2a illustrates the frequency spectrum of the oscillator output, viewed on a linear frequency scale. In this drawing, the output frequency of the oscillator is indicated by the designation $F_0$. The output of the oscillator also includes a noise spectrum (or noise pedestal), the amplitude of which diminishes gradually with increasing separation from the oscillating frequency $F_0$. This oscillator noise pedestal intercepts a "noise floor" at the 3 db bandwidth of the oscillator tank circuit. The noise floor is defined by the noise figure of the oscillator and the thermal noise present at the impedance point at which the output of the oscillator network is taken.

FIG. 2b is a representation of this noise spectrum on a logarithmic scale, wherein the horizontal axis represents the frequency in terms of separation from the oscillating frequency $F_0$. In this figure it will be seen that the noise spectrum is comprised of several components. At frequencies which are outside of the 3 db bandwidth of the oscillator (i.e., separated from the center frequency by a frequency of greater than $F_1$), the thermal noise plus noise figure component predominates and establishes the noise floor. This noise floor has a substantially constant level for all frequencies. Within the 3 db bandwidth of the oscillator, this thermal noise floor is accentuated by the Q of the oscillator tank circuit in such a manner as to add a 6 db/octave slope to the noise spectrum. At some point in the noise spectrum, indicated in the drawing as frequency $F_2$, an additional 3 db/octave slope is added which results from the 1/F noise contributions in the circuit. The frequency $F_2$ at which this 3 db/octave slope begins will depend upon the specific construction of the circuit, the components involved, etc.

It has been found that the 9 db/octave portion of the noise spectrum can be modified to reduce the amount of noise in the oscillation output. The 1/F noise which causes the added 3 db/octave in the noise spectrum can be characterized as a noise source connected in series with the gate electrode of the JFET 12. If, as has been standard practice, capacitor 26 is selected to be of relatively low value, then this capacitor will represent a high impedance to low frequency current noise components. Consequently, these noise components will appear in series with the gate-to-source junction of the JFET, and will modulate the oscillation thereof to increase the magnitude of the 9 db/octave curve shown in FIG. 2b beyond the level due to voltage noise sources within the JFET.

These contributions can be significantly reduced, however, by increasing the size of capacitor 26 to the point where capacitor 26 represents an AC short to the noise frequencies of interest. When capacitor 26 is selected in accordance with this consideration, the noise frequencies will essentially bypass the gate-to-source junction of the JFET so that they do not modulate the oscillator and do not appear as sidebands of the frequency of oscillation $F_0$. This will have the effect of moving the 9 db/octave portion of the curve from NA to NB (see FIG. 2b). The residual portion represented by curve segment NB is caused by those 1/F components whose frequencies are low enough that the capacitor still appears as a high impedance component, and by the I/F voltage noise sources within the JFET. Nonetheless, noise within a selected frequency range of interest can be reduced significantly by this technique. The improvement thus affored is indicated by the dotted line portion of the curves in FIGS. 2a and 2b.

The value of resistor 28 is then selected so as to provide enough loading of the charge stored upon capacitor 26 that a momentary interruption in the operation of the oscillator will not result in an undue delay before the oscillator automatically restarts. Thus, when the oscillator is operating normally, the gate bias voltage developed across capacitor 26 will be sufficient to reduce the loop gain to unity. In order for the oscillator to start up again after a momentary interruption, however, the loop gain must increase to the point where self-sustained oscillation may begin. In other words, the bias voltage must decay enough so that loop gain is again greater than one. Resistor 28 is selected to minimize the time required for this to occur. Resistor 28 would normally be selected to have a value of greater than 100 K if selected upon the basis of this consideration, alone. These values are low enough to provide adequate loading of capacitor 26, yet are not so low as to provide significant loading of the tank circuit 14.

Under certain operating conditions, however, oscillators designed in accordance with this consideration alone may exhibit "motorboating" problems. The loop gain of the oscillator is essentially a linear function of the average gate voltage during an RF cycle. Since the noise sources effectively appear in series with the feedback network, low frequency noise may reduce the average amplitude of the feedback by enough to cause the loop gain of the oscillator to fall below unity for a significant period of time relative to the tank circuit time constant. When this occurs, oscillation will cease until the gate bias voltage returns again to a level at which the loop gain is greater than unity. Oscillation will then begin again until the condition recurs, at which time oscillation will again be quenched. This repetitive cycle will continue, causing the "motorboating" effect.

In order to prevent this problem, the value of resistor 28 should be selected to provide enough decay of the charge stored upon capacitor 26 (and thus enough increase in the gate bias voltage) during each RF cycle that the low frequency noise will not reduce the average amplitude by enough to produce quenching of the oscillator.

At low and moderate oscillator frequencies (less than one megahertz) the loading upon the tank circuit 14 by the gate bias circuit 16 will still be minimal. For higher frequencies, however, it has been found that the reduction in the value of resistor 28 has been accompanied by a dramatic decrease in the input resistance of the JFET. This reduction in input resistance is believed to be due to the storage of minority carriers at the gate-to-source junction, providing a low impedance, resistive effect.

This problem can be eliminated by connecting a low stored-charge diode 30, such as a hot carrier diode, in parallel with the gate-to-source junction. This diode 30 will be poled in the same direction as the gate-to-source junction. Due to the lower contact potential of hot carrier diode 30, the gate-to-source junction of JFET 12 will never become forward biased. This junction will thus remain a very high impedance, and diode 30 will instead providing the peak rectification function. Due to the low level of storage charge in hot carrier diode 30, however, it will provide a much higher level of impedance then would otherwise be present if the gate voltage were allowed to increase to the point where the gate-to-source junction of JFET 12 conducted.

FIG. 2 illustrates a system employing an oscillator circuit constructed in accordance with the teachings of the present invention. In this figure, the frequency of oscillation of an oscillator 50 is controlled by a tuning control circuit 52. The output of the oscillator 50 is directed to an amplifier 54 which may comprise a series of class C amplifiers. These amplifiers serve the dual function of amplifying the RF signal, and stabilizing its amplitude with variations in temperature, etc.

The amplified oscillator signal is then filtered by a harmonic filter 56 which has bandpass selected to pass only the particular frequency of interest, while rejecting all other harmonics. The filtered signal is supplied to an RF modulator circuit 58 where it is modulated by a signal (for example an audio signal) supplied by a modulating signal source 60. RF modulator 58 may be any conventional modulator for modulating the RF signal in accordance with AM, FM, SSB, DSB, etc. techniques.

The RF oscillator circuit 50 utilized in this system generally includes a junction field effect transistor 100, a tank circuit 102, and a gate biasing circuit generally indicated at 104.

Tank circuit 102 is shown as including an inductor 106 and an arrangement of capacitors including a capacitor 108, a capacitor 110, and a varactor 112. The frequency of oscillation of the oscillator is varied by changing the capacitive value of varactor 112. This is done by means of a DC bias voltage applied across the varactor 112 by a tuning control circuit 52. Capacitor 110 isolates the DC bias voltage from the remainder of the circuit. The gate bias circuit 104 includes a parallel connection of a capacitor 114 and a resistor 116 which are selected in accordance with the specific design considerations set out above. A hot carrier diode 118 is connected across the gate-to-source junction of JFET 100, for the reasons enumerated previously.

In the illustrated embodiment, inductor 106 is a five and one-half turn coil having an impedance of approximately 10 k. The first tap, connected to the source of JFET 100, is taken after one full turn in the inductor, whereas the feedback tap is taken two full turns thereafter. As a result of this, the impedance seen between the two taps in inductor 106 represents an impedance of approximately 1 k.

In this example, the significant on-channel noise is defined as falling between approximately 100 and 1000 Hz of the carrier. Capacitor 114 is selected to have a value of approximately 6.8 microfarads, whereas resistor 116 is selected to have a resistance of approximately 12 k. Capacitor 114 may be a conventional dip-type tantalum capacitor, whereas resistor 116 will be chosen as a type whose noise index will not contribute significantly to the I/F voltage noise otherwise remaining due to the voltage noise of the JFET. This capacitor 114 provides a relatively low impedance to frequencies above 100 $H_z$. Noise components due to 1/F current noise above 100 $H_z$ are therefore essentially eliminated from the output of this oscillator.

Although the invention has been described with respect to specific embodiments, it will be appreciated that various rearrangements and alterations or parts may be made without departing from the spirit and scope of the present invention, as defined in the appended claims. Thus, for example, although the specific embodiments have in each case utilized conventional JFET's as the active elements, other devices relying upon junction field effects for their operation could as easily be used. Such other devices include MESFETS, dual gate JFET's, etc. In the claims which follow, it is intended that the term "junction field effect semiconductor device" be interpreted to comprehend all these devices, as well as other, similar devices.

What is claimed is:

1. A low noise high frequency oscillator comprising:

a junction field effect semiconductor device having first and second electrodes defining therebetween a primary current path, and a gate electrode for controlling current flow between said first and second electrodes;

a tuned circuit coupled between at least one of said first and second electrodes and said gate electrode;

a gate bias circuit for providing a DC bias voltage to said gate electrode including a capacitor coupled between said gate electrode and a power supply connection, and a resistor connected to provide a DC current path across said capacitor, wherein said capacitor and resistor of said gate bias circuit have values selected so that said gate bias circuit has a low impedance at selected noise frequencies, 2. A low noise, high frequency oscillator as set forth in claim 1 wherein said tuned circuit is coupled to said gate electrode from a point in said tuned circuit having a low impedance, DC coupling to a power supply connection, and wherein said capacitor of said gate biasing means is connected between said gate electrode and said point in said tuned circuit so as to provide said coupling of said tuned circuit to said gate electrode.

3. A low noise, high frequency oscillator as set forth in claim 1, wherein the junction between said gate electrode and one of said first and second electrodes provides peak rectification of the signal applied to said gate electrode by said tuned circuit, so as to thereby develop a biasing voltage across said capacitor of said gate biasing means.

4. A low noise, high frequency oscillator as set forth in claim 1, wherein a low stored-charge diode is connected between said gate electrode and one of said first and second electrodes and provides peak rectification of the signal applied to said gate electrode by said tuned circuit so as to thereby develop a biasing voltage across said capacitor of said gate biasing means.

5. A low noise, high frequency oscillator as set forth in claim 4, wherein said low stored-charge diode is a hot carrier diode.

6. A low noise, high frequency oscillator as set forth in claim 1, wherein said junction field effect semiconductor device comprises a JFET.

7. An RF signal source for use in a radio receiver or transmitter, comprising a self-biasing junction field effect semiconductor amplifier having a tuned circuit coupled in a feedback arrangement therewith so as to define a feedback oscillator, said amplifier having a gate biasing circuit comprised of a capacitor and a resistor, said resistor and capacitor having values selected so that said gate biasing circuit provides a low impedance path for low frequency noise components.

8. An RF signal source as set forth in claim 7, and further comprising means responsive to the RF signal generated by said feedback oscillator for providing an RF signal whose amplitude remains stable independently of variations in the amplitude of said RF signal generated by said feedback oscillator.

* * * * *